United States Patent [19]
Lenni

[11] Patent Number: 5,479,331
[45] Date of Patent: Dec. 26, 1995

[54] SMALL FORM FACTOR POWER SUPPLY

[75] Inventor: Thomas W. Lenni, Laguna Niguel, Calif.

[73] Assignee: Comarco Wireless Technologies, Inc., Irvine, Calif.

[21] Appl. No.: 233,121

[22] Filed: Apr. 26, 1994

[51] Int. Cl.$^6$ .................................................. H02M 3/335
[52] U.S. Cl. .................................................. 363/21; 363/97
[58] Field of Search .................................. 363/17, 20, 24, 363/21, 25, 78, 79, 80, 97, 98, 132; 232/212

[56] References Cited

U.S. PATENT DOCUMENTS

| | | | |
|---|---|---|---|
| 4,257,089 | 3/1981 | Ravis | 363/25 |
| 4,307,441 | 12/1981 | Bello | 363/25 |
| 4,734,839 | 3/1988 | Barthold | 363/16 |
| 4,885,674 | 12/1989 | Varga et al. | 363/21 |
| 4,890,214 | 12/1989 | Yamamoto | 363/49 |
| 5,019,954 | 5/1991 | Bourgeault et al. | 363/21 |
| 5,146,394 | 9/1992 | Ishii et al. | 363/16 |
| 5,177,675 | 1/1993 | Archer | 363/25 |
| 5,309,348 | 5/1994 | Lau | 363/71 |

*Primary Examiner*—Peter S. Wong
*Assistant Examiner*—Adolf Berhane
*Attorney, Agent, or Firm*—Spensley Horn Jubas & Lubitz

[57] ABSTRACT

A new, small form factor power supply is disclosed that provides a regulated DC power supply in a package that radiates relatively little heat and that occupies 2.75" by 4.5" by 0.75". The secondary coil of the transformer is positioned at the summing node of the flux of the primary coils and the phase of the drive signals provided to the secondary coils is regulated to control the current and voltage provided by the secondary circuit. Preferably, all circuit components are surface mount devices and the transformer cores are E block planar cores mounted on the printed circuit board.

12 Claims, 4 Drawing Sheets

SMALL FORM FACTOR POWER SUPPLY

NOTICE OF COPYRIGHTS

A portion of the disclosure of this patent document contains material which is subject to copyright protection. The copyright owner has no objection to the facsimile reproduction by anyone of the patent disclosure, as it appears in the United States Patent and Trademark Office patent files or records, but otherwise reserves all copyright rights whatsoever.

BACKGROUND OF THE INVENTION

1. Field of the Invention

This invention relates to power supplies and in particular relates to small form factor power supplies.

2. Background of the Invention

Prior art power supplies include a variety of techniques, particularly those used for powering microelectronics such as the class of computers commonly known as "notebook" computers such as the Powerbook Series available from Apple Computer of Cupertino California and the Thinkpad Series available from International Business Machines of Armonk, N.Y. More recently, even smaller personal computers referred to as "sub-notebooks" have also been developed by various companies such as Hewlett-Packard's Omnibook. The goal of these notebooks and sub-notebooks designs is to reduce the size and weight of the product. Currently, notebooks typically weigh about six pounds and sub-notebooks weigh slightly less than four pounds.

Many of these notebook and sub-notebook computers have a battery that must be recharged. Also, typically the computers are designed to be operated from external power sources such as line current and the electrical power system of automobiles.

To power these computers, the manufacturer typically provides an external power source. The external power source may be a switching power supply that weighs close to a pound and is about eight inches long, four inches high and about four inches high.

Such external power supplies therefore contribute substantial additional weight the user of the computer must carry with him or her to permit battery charging and operation from an electrical socket. Further, the external power supply is bulky and may not be readily carried in typical cases for such notebook and sub-notebook computers.

While it has long been known to be desirable to reduce the size and weight of the power supply, that has not been readily accomplished. Many of the components such as the transformer core are bulky and have significant weight. Further, such power supplies may need to be able to provide DC power of up to seventy-five watts, thereby generating substantial heat. Due to the inherent inefficiencies of power supplies, this results in substantial heat being generated within the power supply. Reduction of the volume, weight and heat are all critical considerations for a power supply of this type of application.

SUMMARY OF THE INVENTION

These and other objects are accomplished through novel embodiments of a power supply having a transformer. The primary portion includes a primary rectifier circuit, a controller, first and secondary primary drive circuits each coupled magnetically by a coil to the core and a primary feedback circuit magnetically coupled by a separate core. The secondary portion includes a secondary output circuit magnetically coupled by a coil to the core that provides the regulated DC output and a secondary feedback back circuit magnetically coupled to the second core to provide a signal to the primary feedback circuit.

The controller provides a separate square wave signal to each of the two primary circuits and the phase of the square wave signals may be altered relative to each other as determined by the controller. The secondary circuit is positioned on the core relative to the two primary circuits so that the secondary circuit coil is positioned at a summing point on the core of the first and second primary circuit coils. The DC voltage and current levels produced at the output of the secondary circuit are monitored by the secondary feedback circuit to provide through a secondary feedback coil and a primary feedback coil a signal to the controller. The controller alters the phase between the signals driving the two coils to produce the desired output DC voltage and current at the secondary coils. This results in providing a regulated DC power supply with high efficiency.

By mounting all of the components on a printed circuit board using planar or low profile cores and surface mounted integrated circuits, a small form factor power supply can be attained. Given the high efficiency of the conversion and regulation, the system minimizes dissipation of heat permitting the entire power supply to be mounted within a high impact plastic container dimensioned approximately 2.75" by 4.5" by 0.75".

DETAILED DESCRIPTION OF THE PREFERRED EMBODIMENTS

Figure 1:
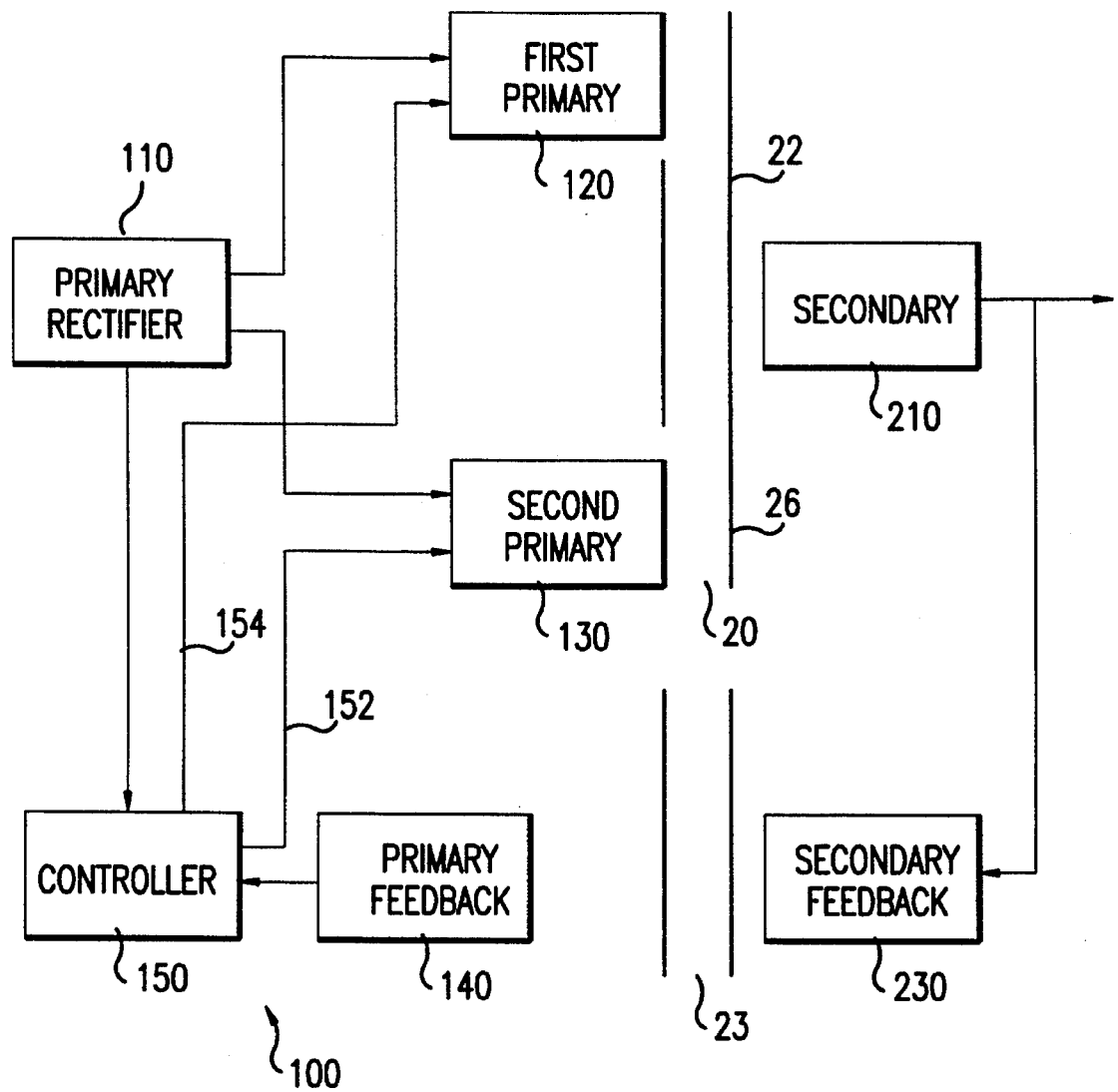
FIG. 1 is a block diagram of a first embodiment of the disclosed invention.

FIG. 1 shows a block diagram of the power supply according to the invention. All components on the left side of a magnetic core 20 are part of the primary portion 100 and all portions on the right hand side are part of the secondary portion 200 of the power supply.

The primary portion 100 includes a primary rectifier and input circuit 110, a first primary and drive circuit 120, a second primary and drive circuit 130, a primary feedback circuit 140 and a controller 150. The secondary portion 200 includes a secondary output circuit 210 and a secondary feedback circuit 240.

The function of the primary rectifier and input circuit 110 is to couple the embodiment 10 to the line voltage (for example 110 volt, 60 Hz), to rectify that voltage and provide DC power for the remainder of the primary portion 100 and a ground path for the primary circuits 120 and 130. The controller 150, which may be a Unitrode 3875 provides two square wave driver signals 152 and 154 having alterable phases to the first and the second primary circuits 120 and 130. The first and second primary circuits are resonant circuits that are resonant at about the frequency of the driver signals and include coils that are coupled to the core 20, which may be a planar or low profile "E" type core, which may be any low loss material, as is shown in a sectional view in FIG. 2. Hence, the driver signals are magnetically coupled to the core 20 by first and second primary coils contained within the circuits 120, 130.

Figure 2:
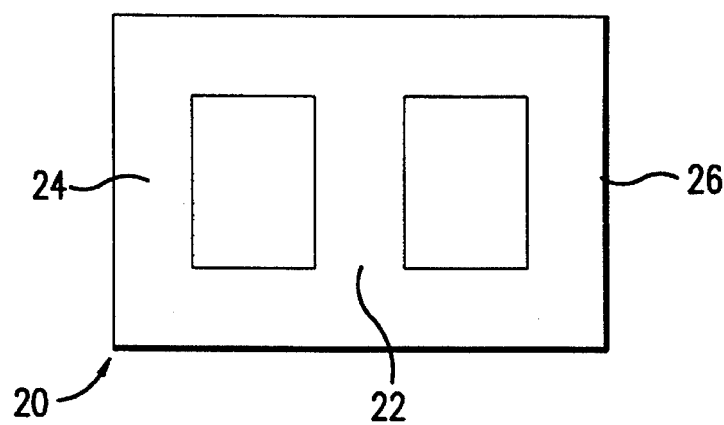
FIG. 2 is a sectional view of the E core for use in the embodiments of FIG. 1.

The coil 212 in the secondary circuit 210 is preferably positioned relative to the coils of the two primary cores so that the coil in the secondary circuit is at a summing point of the magnetic flux from the primary circuit coils. If a planar "E" block type core as shown in FIG. 2 is used, the coil 212 for the secondary circuit 210 is positioned about the central leg 22. The coil for the feedback circuits 140 is positioned on one of the outer legs 24, 26. As a result, the magnetic flux from the two primary coils of the primary circuits 120, 130 are summed at the position where the secondary coil 212 for the secondary circuit 210 is positioned. (This positioning of the coils is shown in FIG. 1 by using the double line to indicate the central leg 22 and a single line to represent the outer legs 24, 26).

The amplitude of the DC voltage and current produced by the secondary circuit 210 are monitored by the secondary feedback circuit 230. The primary feedback circuit 140 and the secondary feedback circuit 230 are magnetically coupled by coils positioned on another core 23 to provide a feedback signal to the controller 150. In response to the feedback signal, the controller alters the relative phase between the two driver signals 152 and 154 to obtain the desired magnitude of the voltage and current. Since the secondary coil 212 is located at a summing point on the core of the flux from the two primary coils, as the phase between the driving signals 152 and 154 to the two primary coils alters, the magnitude of the current and voltage induced in the secondary coil will vary. This will permit control of the secondary circuit 210 output voltage and current, thereby providing a readily controlled output voltage.

Figure 3A:
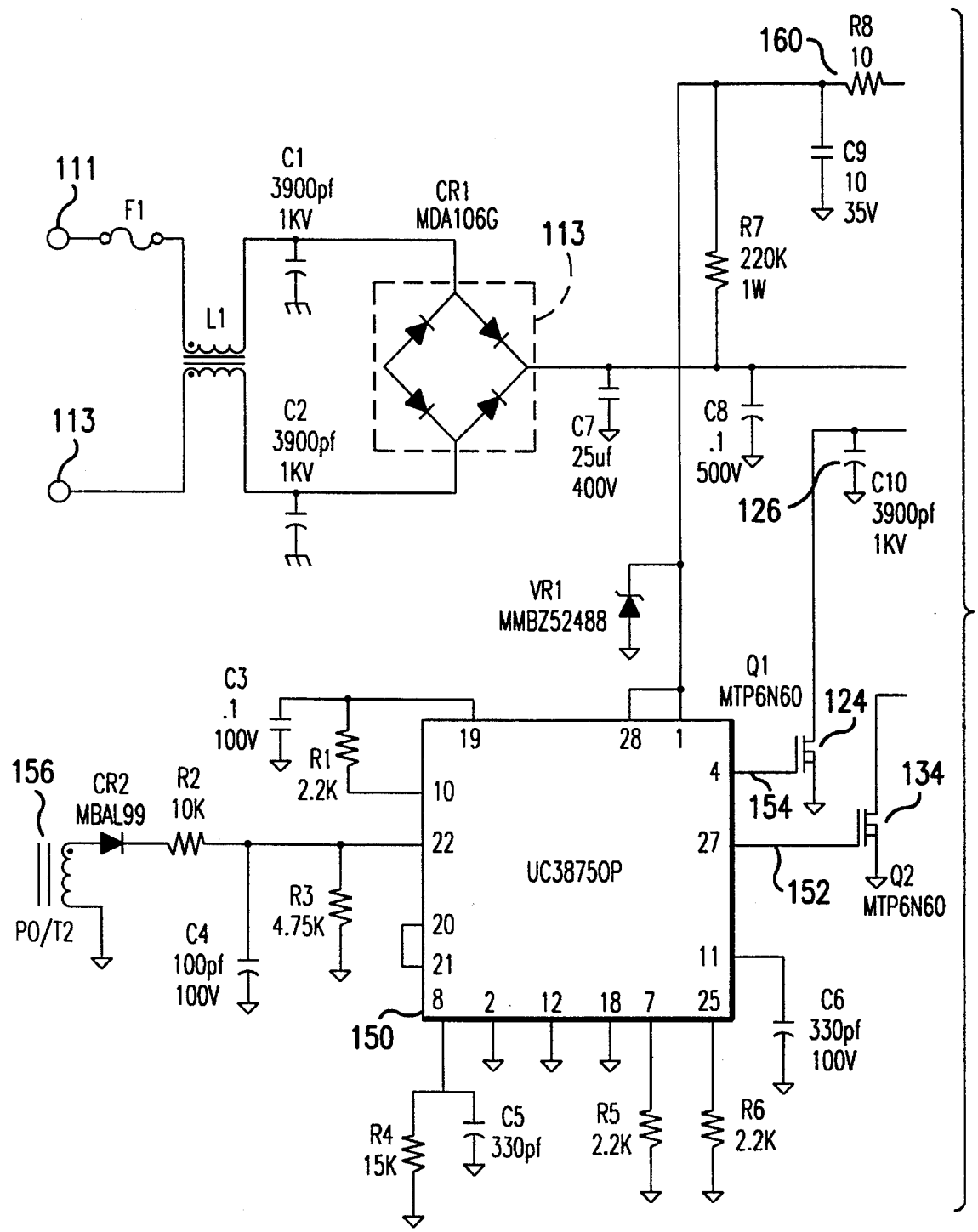
FIG. 3 is a detailed circuit schematic of the embodiment of FIG. 1.
Figure 3B:
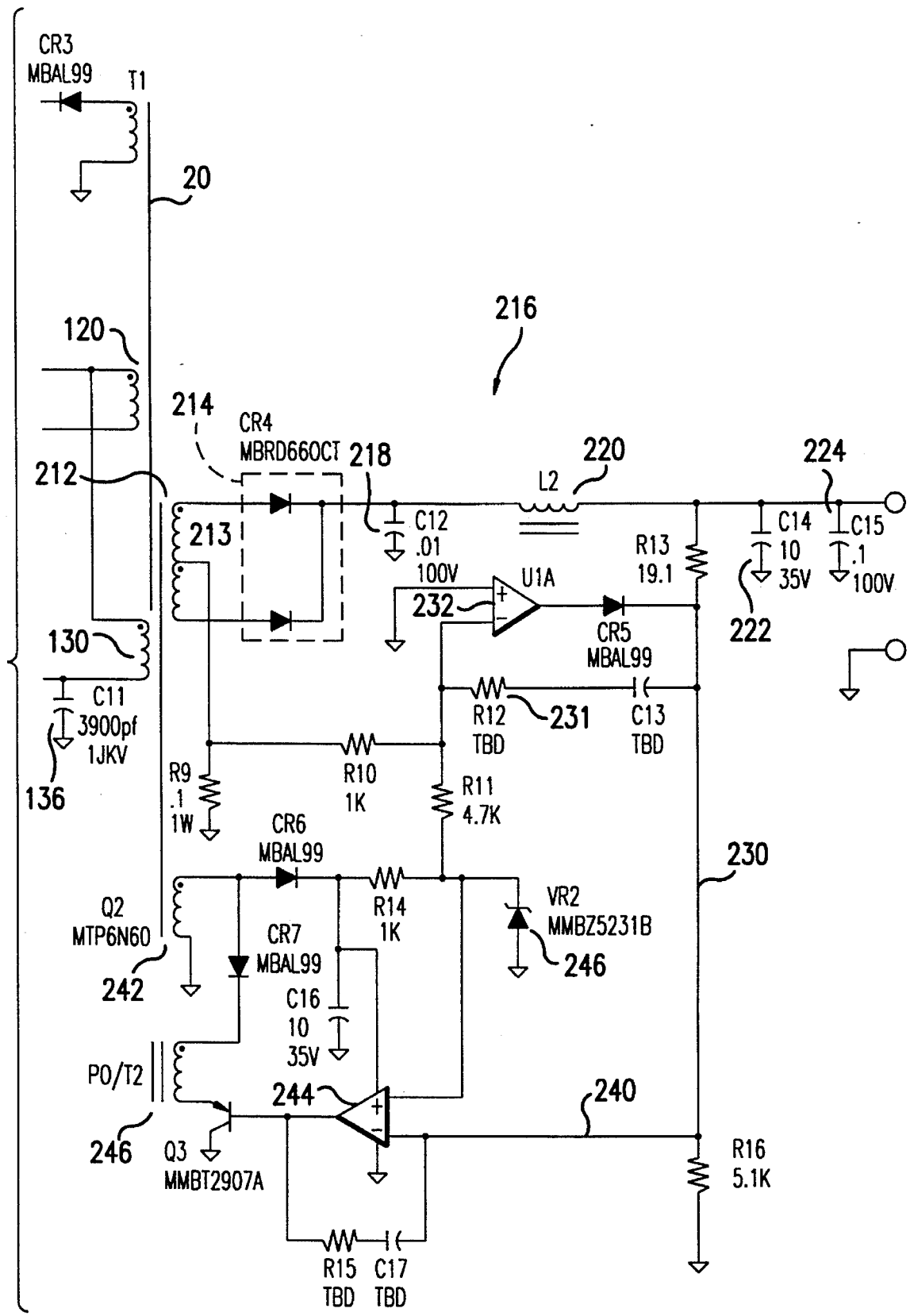

FIG. 3 shows a more detailed schematic of an embodiment of the invention. A standard AC plug may be coupled to input nodes 111, 112 to a first filter coil L1 that is coupled to a full wave rectifier bridge 113, which may be a MDA106G. Filtering capacitors C1, C2, C7, C8 are also coupled to the bridge 113 and one side of the bridge is coupled to AC ground.

The other side of the bridge is coupled to the primary coils 122 and 132 of the first and second primary circuits 120, 130 respectively. The other terminal of the primary coils 122, 132 are coupled to the remainder of the primary circuits 120 and 130. Each of these primary circuits 120, 130 also comprise a drive field effect 124, 134, which may be a MTP6N60 and a capacitor 126, 136. The coils 122, 132, transistors 124, 134 and capacitors 126, 136 are selected so that the resonant frequency of the circuits 120, 130 is at about the frequency of the drive signals 152, 154 to maximize the efficiency of the power supply. In this embodiment, the drive signal frequency is about one Megahertz, though other frequencies may be used.

The drive signals 152 and 154 are supplied by a controller 150 such as a a Unitrode UC3875QP or other similar product. The controller 150 receives the biasing power at pins 28 and 1 from the primary power supply circuit 160.

Each of the coils 122 and 132 induce a varying magnetic field in the outer legs of the core 20. The secondary coil 212, which has a center tap 213, is coupled to a half wave rectifier bridge 214, which may comprise an MBRD660CT, and then is coupled to a filtering circuit 216 comprised of a capacitor 218, an inductor 220, and capacitors 222 and 224 to provide a DC regulated output 226.

The regulation is provided through feeding back to the controller 150 a signal modulated by a current sensing circuit 232 and a voltage sensing circuit 240 comprising the feedback circuit 230. To provide the carrier for modulation, a further secondary carrier coil 242 is coupled to one of the outer legs of the core 20. One of the legs of this transformer coil 242 is coupled to an isolation feedback transformer T2.

The current sensing circuit takes the output of the center tap of the secondary coil 212 and provides a voltage drop across resistor R9 that is provided to a compressing circuit 234. The output of the compressing circuit 234 is added to a voltage dropped across R13 and is provided to an amplifier 244 in the voltage sensing circuit 240. The other input in the voltage sensing circuit is a reference voltage developed by the zener reference diode 246 and also provided as a biasing level to the compressing circuit 234. The output of the amplifier 244 is provided to the base of bipolar transistor Q3, which may be a MMBT2907T, configured in a common base configuration, to amplitude modulate the current through the secondary side coil 246.

The primary side coil 156 of feedback transformer T2 is magnetically coupled to the secondary side coil of 246 and generates an amplitude modulated signal that is envelope detected and integrated to provide a feedback voltage at input 22 of the controller 150.

As a result, as the amplitude of the envelope of the modulated signal increases, the voltage at input 22 of the controller 150 increases. When the controller 150 determines that the voltage has exceeded a predetermined limit, indicating that either the current or voltage at the output has increased beyond the predetermined maximum, the relative phase difference of driver signals 152 and 154 is increased. If the amplitude at input 22 decreases below a predetermined threshold indicating that the voltage or the current is below the desired levels, the relative phase of signals 152 and 154 is decreased towards zero to increase the voltage or current. Due to the summing effect of the magnetic flux at secondary coil 212, a highly efficient control or regulation of the power supply circuit is obtained.

Figure 4:
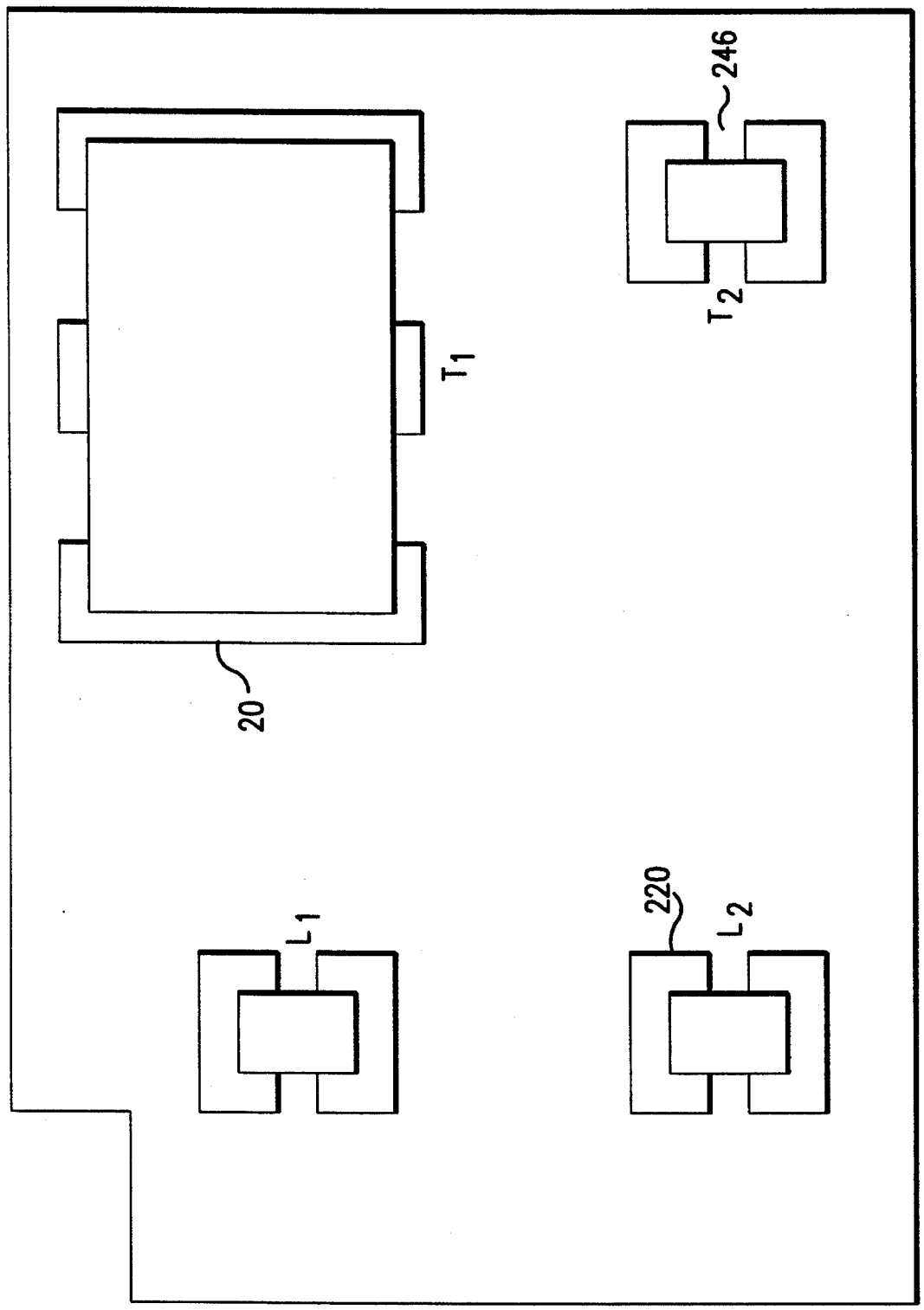
FIG. 4 is a top planar view of a printed circuit board containing the circuit of FIG. 3.

Because of the high efficiency that is attained with this circuit, heat dissipation is much less and it is possible to reduce the size of power supply to a much smaller form factor. In particular, each of the electrical components in FIG. 2 other than the transformer may be mounted using surface mount devices on a printed circuit board. Further, each of the inductors and transformer cores are low profile planar cores mounted through cutouts formed by the printed circuit board. The coils of the inductors and transformers are provided by wiring traces on the circuit board that wrap around the portion of the appropriate core penetrating the circuit board. As a result, an extremely compact form factor may be obtained. FIG. 4 shows a top planar view of such a printed circuit board with each inductor L1, L2 and transformer cores T1 and T2 identified.

Notwithstanding the smaller size of the form factor, heat dissipation is not a serious problem due to the increased efficiency of the power supply according to the disclosed embodiments. Therefore, with all the components assembled on a printed circuit board as described above, the assembled printed circuit board may be housed within a housing formed from an injection molded plastic dimensioned 2.75" by 4.5" by 0.75" without undue heating of the housing. For example, with such a housing, surface temperatures on the housing should not exceed one hundred twenty degrees Fahrenheit. A normal electrical plug such as a phased, three-prong plug, is coupled by an input cable (not shown) through a hole formed in the housing and an output cable (not shown) having a connector (not shown) coupled to the printed circuit board and to an output connector. Alternatively, the three-prong plug (not shown) may be formed within the housing with the prongs projecting from the housing to avoid the opening for a cable. Also, the plug may be of a pivotable type (not shown) mounted on the surface of the housing and rotate between a recessed position in a cutout formed within the housing and an in use position projecting at ninety degrees from the surface of the housing.

Although the disclosed embodiment shows only one regulated DC voltage being supplied (for example +5 volts DC), it would readily be understood by those of ordinary skill in the field that other regulated or unregulated voltages may also be supplied with minor modifications to the disclosed embodiment. For unregulated voltages, additional secondary coils (not shown) with the appropriate number of windings to provide the voltage may be magnetically coupled to any of the legs of the transformer core 120. The appropriate circuitry must then be provided for rectifying and filtering the output of this additional secondary coil. Similarly, an additional regulated voltage may be supplied by providing a feedback control circuit such as the type described above that provides the appropriate feedback.

Thus, a small, highly efficient form factor power supply has been disclosed that may be readily mounted within a small container. Regulation of the output voltage may be readily attained. Alternatively, with appropriate heat transfer components, the disclosed power supply may actually be mounted within a notebook or even a subnotebook-size computer. Still further, the secondary coil can be positioned where the magnetic flux induced in the core from the two primary coils destructively interfere with each other and where the phase of the two driving signals is approximately one hundred eighty degrees out of phase. Other alternatives will be readily apparent to those of skill in the art. Resort to the true scope of the invention should be had by resort to the claims.

I claim:

1. A power supply circuit, the circuit comprising:

a magnetic core;

first and second primary coals electromagnetically coupled to the core to induce magnetic flux in the core; and a secondary coil electromagnetically coupled to the core to generate an electromotive force based upon the magnetic flux in the core, wherein the secondary coil is positioned relative to the primary coils such that the flux generated by the primary coils constructively interfere;

driving circuitry coupled to each of the primary coils to provide a separate driving signal to each primary coil and each driving signal having a phase a phase relationship existing between the driving signals;

a rectifier coupled to the secondary coil to provide a regulated DC signal and a feedback means coupled between the output of the rectifier and the driving circuitry to alter the phase relationship between the driving signals to regulate the DC signal.

2. The power supply circuit of claim 1, wherein the feedback means includes:

a current sensing circuit coupled to the secondary coil to sense current flow through the secondary coil;

a voltage sensing circuit coupled to the regulated DC signal;

an amplitude modulation circuit to amplitude modulate a signal based upon the sensed voltage and current flow; and a feedback transformer coupled to the amplitude modulation circuit.

3. The power supply circuit of claim 1, wherein the core is an E block type and each primary coil is mounted on an outer leg of the core and the secondary coil is mounted on an inner leg.

4. The power supply circuit of claim 2, wherein the core is an E block type and each primary coil is mounted on an outer leg of the core and the secondary coil is mounted on an inner leg of the core.

5. The power supply circuit of claim 1, wherein the core is a low profile magnetic core.

6. A method for providing a regulated power supply providing a regulated direct current output signal having at least one parameter at a predefined level, the method comprising:

providing a first and second driving signal each having a phase, a controllable phase relationship existing between the signals;

providing a first magnetic core with a plurality of primary coils magnetically coupled to the core to produce magnetic flux therein and at least a secondary coil magnetically coupled to the core such that the secondary coil is positioned at a point where the magnetic flux from the two primary coils constructively interfere so that the secondary coil has a current induced therein when the primary coils are driven;

providing the direct current output signal based upon the current induced in the secondary coil, sensing at least one parameter of the output signal;

providing a feedback signal based upon the sensed parameter; and altering the controllable phase relationship exists between the driving signals to keep the parameter of the output signal within a predetermine range of the level.

7. The method of claim 6, wherein the parameter is current.

8. The method of claim 6, wherein the parameter is voltage.

9. The method of claim 6, wherein each primary coil is part of a separate resonant circuit.

10. The method of claim 9, wherein the frequencies of the drive signals are substantially at the resonant frequency of the resonant circuit.

11. The method of claim 6, wherein the providing of the feedback signal comprises:

inducing a feedback current based upon the magnetic flux induced in the core; and amplitude modulating the feedback current based upon the parameter.

12. A power supply circuit, the circuit comprising:

a magnetic core;

first and second primary coils electromagnetically coupled to the core to induce magnetic flux in the core; and a secondary coil electromagnetically coupled to the core to generate an electromotive force based upon the magnetic flux in the core, wherein the secondary coil is positioned relative to the primary coils such that the flux generated by the primary coils destructively interfere:

driving circuitry coupled to each of the primary coils to provide a separate driving signal to each primary coil and each driving signal having a phase, a phase relationship existing between the driving signals;

a rectifier coupled to the secondary coil to provide a regulated DC signal; and a feedback means coupled between the output of the rectifier and the driving circuitry to alter the phase relationship between the driving signals to regulate the DC signal.

* * * * *